(12) United States Patent
Bodin et al.

(10) Patent No.: US 10,273,580 B2
(45) Date of Patent: Apr. 30, 2019

(54) HEATING DEVICE

(71) Applicant: AIXTRON SE, Herzogenrath (DE)

(72) Inventors: Pierre-Arnaud Bodin, Buckinghamshire (GB); Mark Edlef Oppen, Hertfordshire (GB); Keith Allen, Cambridgeshire (GB); Hugo Silva, Aachen (DE)

(73) Assignee: AIXTRON SE, Herzogenrath (DE)

(*) Notice: Subject to any disclaimer, the term of this patent is extended or adjusted under 35 U.S.C. 154(b) by 445 days.

(21) Appl. No.: 15/038,731

(22) PCT Filed: Nov. 14, 2014

(86) PCT No.: PCT/EP2014/074552
§ 371 (c)(1),
(2) Date: May 23, 2016

(87) PCT Pub. No.: WO2015/078704
PCT Pub. Date: Jun. 4, 2015

(65) Prior Publication Data
US 2017/0002462 A1 Jan. 5, 2017

(30) Foreign Application Priority Data
Nov. 26, 2013 (DE) .................. 10 2013 113 045

(51) Int. Cl.
*C23C 16/458* (2006.01)
*H05B 3/12* (2006.01)
(Continued)

(52) U.S. Cl.
CPC .......... *C23C 16/4586* (2013.01); *C23C 16/46* (2013.01); *H05B 3/12* (2013.01);
(Continued)

(58) Field of Classification Search
CPC .......... H05B 3/12; H05B 3/265; H05B 3/143; H05B 3/74; H05B 2203/037;
(Continued)

(56) References Cited

U.S. PATENT DOCUMENTS

| 5,063,031 A | 11/1991 | Sato |
| 2004/0149227 A1 | 8/2004 | Saito et al. |

(Continued)

FOREIGN PATENT DOCUMENTS

| DE | 7518153 U | 10/1975 |
| DE | 10329107 A1 | 7/2004 |

(Continued)

OTHER PUBLICATIONS

International Search Report and Written Opinion dated Feb. 4, 2015, for International Patent Application No. PCT/EP2014/074552 (filed Nov. 14, 2014), including English translation, 15 pages.

*Primary Examiner* — Shawntina Fuqua
(74) *Attorney, Agent, or Firm* — Ascenda Law Group, PC

(57) ABSTRACT

A device includes at least a first electrically conductive contact plate, at least a second electrically conductive contact plate and a plurality of heating elements connected electrically in parallel. Each of the plurality of heating elements includes at least one resistance heating unit, respectively. Each of the heating elements is connected by means of a first connecting contact to the heating elements is connected by means of a first connecting contact to the first contact plate and by means of a second connecting contact to the second contact plate, in which both contact plates lie in a common first plane. The resistance heating units are arranged along a spiral or arched line around a center of the device. To expand the service life of the device at reduced manufacturing costs, a plurality of heating units are arranged consecutively or nested with each other along (Continued)

the ached or spiral line, and both the first and second contact plates comprise interlocking comb-like contact extensions.

16 Claims, 18 Drawing Sheets

(51) Int. Cl.
  *H05B 3/26* (2006.01)
  *C23C 16/46* (2006.01)
(52) U.S. Cl.
  CPC ....... *H05B 3/265* (2013.01); *H05B 2203/002* (2013.01); *H05B 2203/014* (2013.01); *H05B 2203/016* (2013.01); *H05B 2203/022* (2013.01); *H05B 2203/037* (2013.01)
(58) Field of Classification Search
  CPC ........ H05B 2203/022; H05B 2203/014; H05B 2203/002; H05B 2203/016; H01L 21/67103; H01L 21/67115; H01L 21/205; H01L 21/20; H01L 21/365; H01L 21/324; H01L 21/66; H01L 21/68735; C30B 25/10; C30B 25/12; C30B 29/40; C30B 29/403; C30B 29/48
  See application file for complete search history.

(56) References Cited

U.S. PATENT DOCUMENTS

| | | |
|---|---|---|
| 2005/0045618 A1 | 3/2005 | Ito |
| 2005/0258160 A1 | 11/2005 | Goto et al. |
| 2006/0185595 A1 | 8/2006 | Coll et al. |
| 2010/0162956 A1 | 7/2010 | Murakami et al. |

FOREIGN PATENT DOCUMENTS

| | | |
|---|---|---|
| DE | 102005056536 A1 | 5/2007 |
| DE | 102006018515 A1 | 10/2007 |
| DE | 102007009145 A1 | 8/2008 |
| DE | 102007027704 A1 | 12/2008 |
| DE | 102009043960 A1 | 3/2011 |
| EP | 1220303 A1 | 7/2002 |
| EP | 1233651 A1 | 8/2002 |

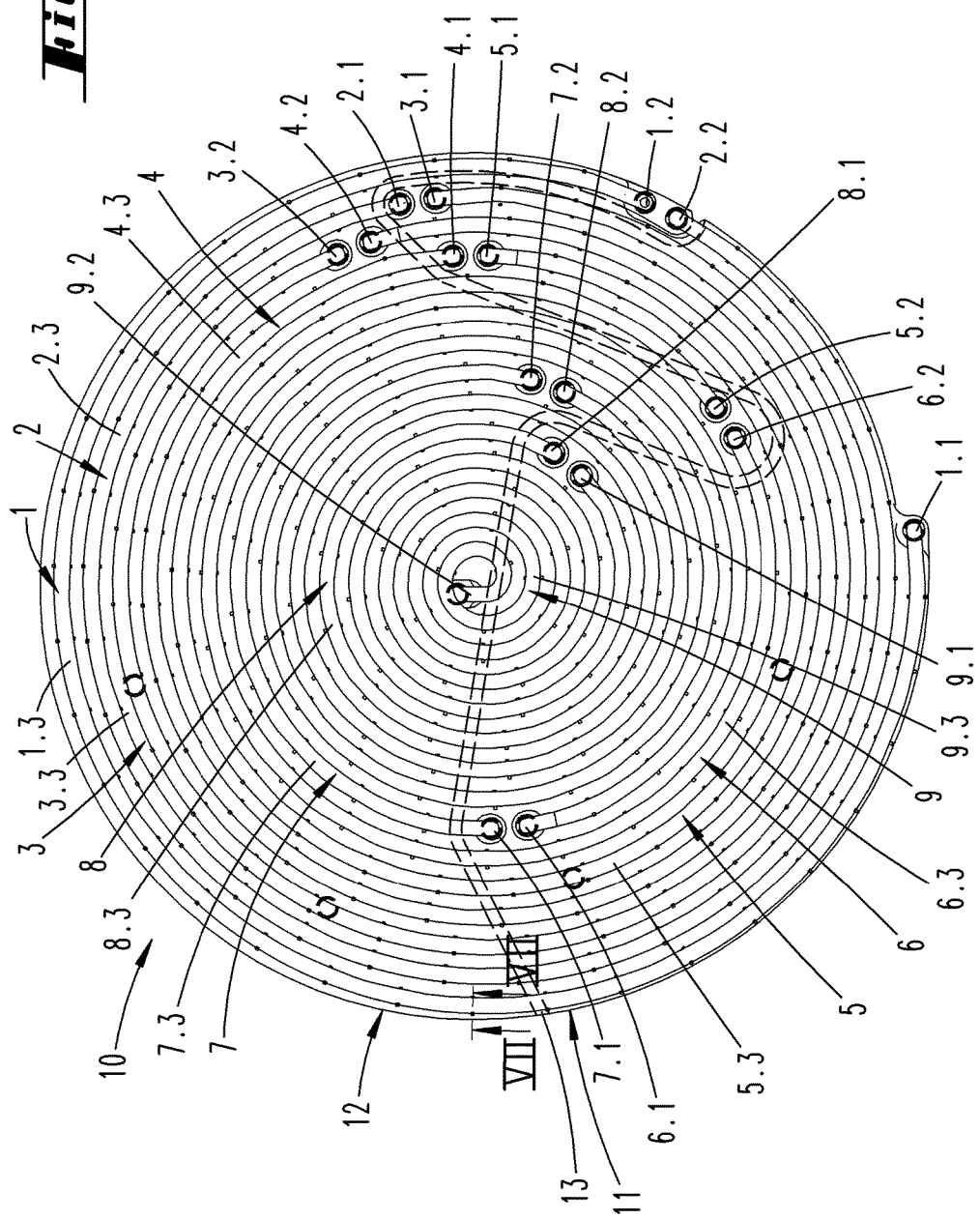

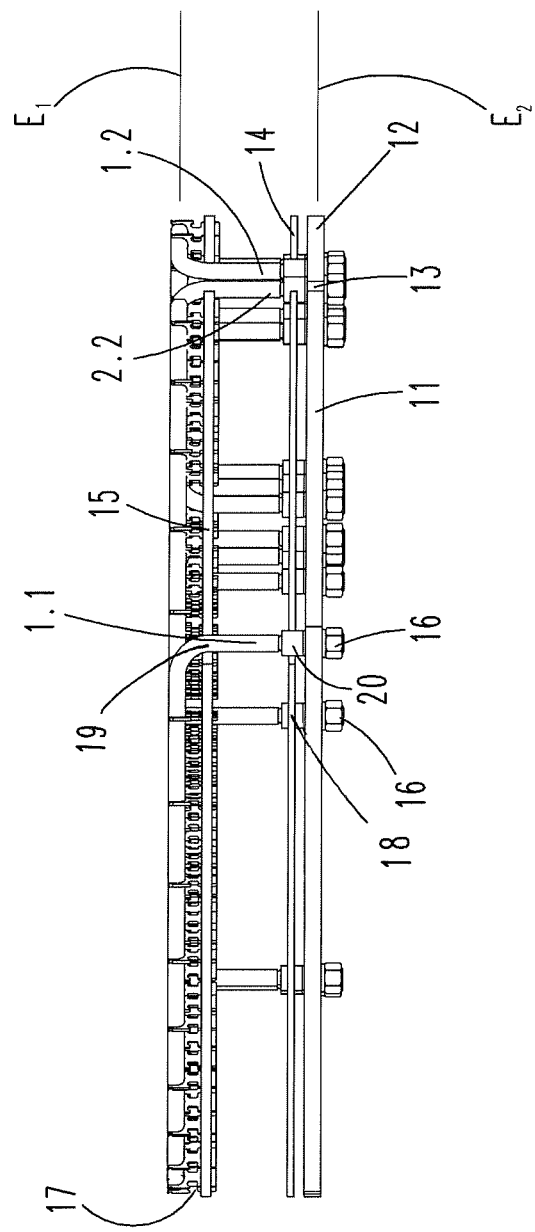

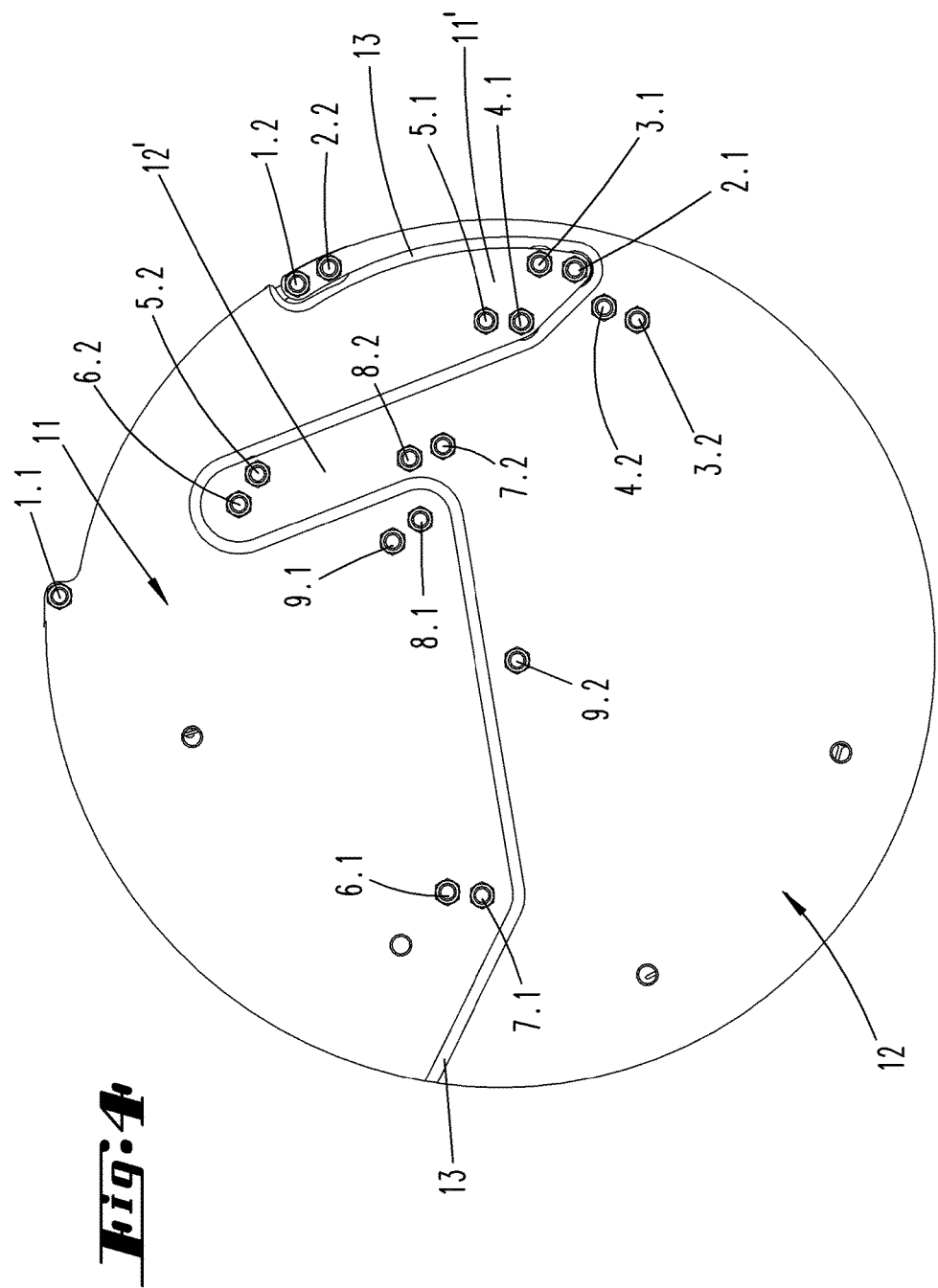

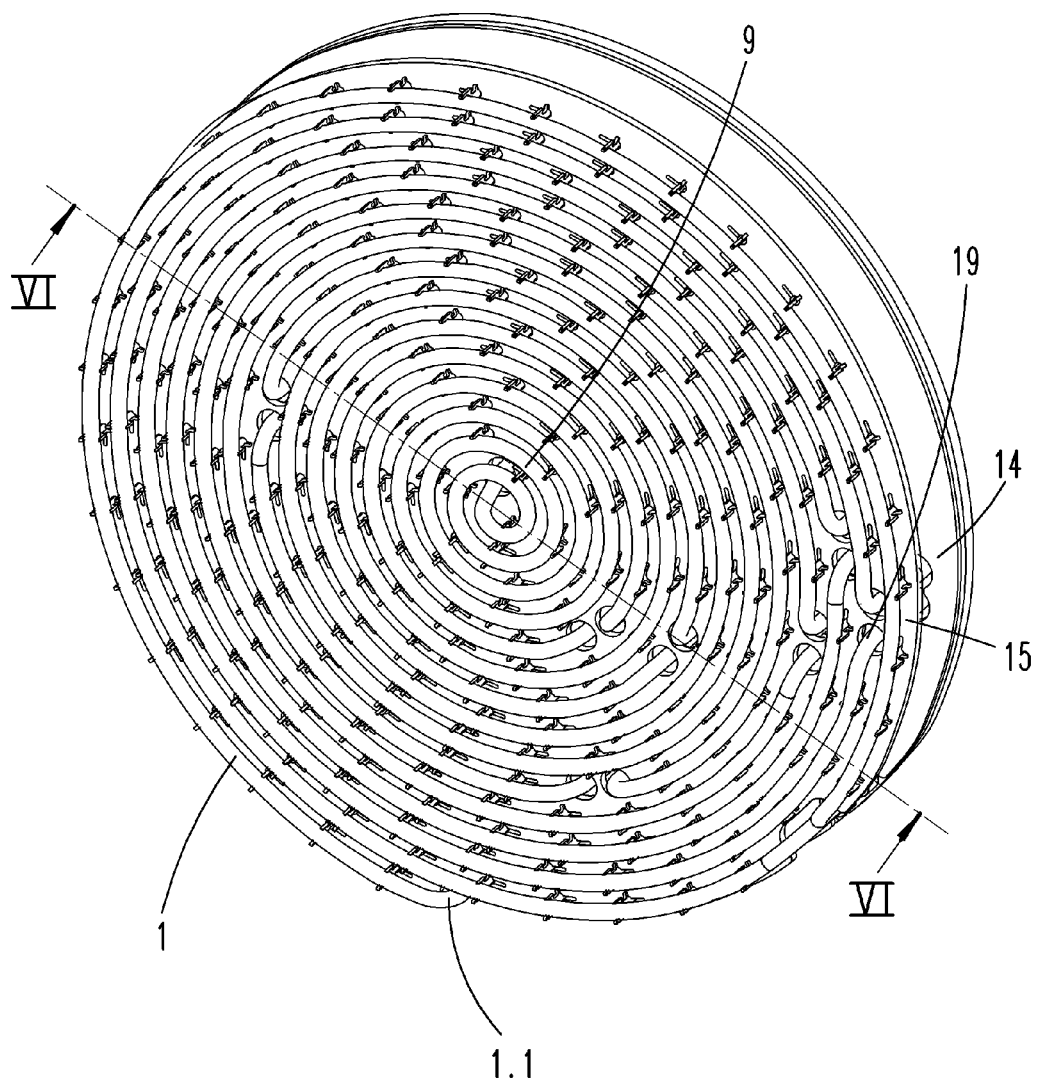

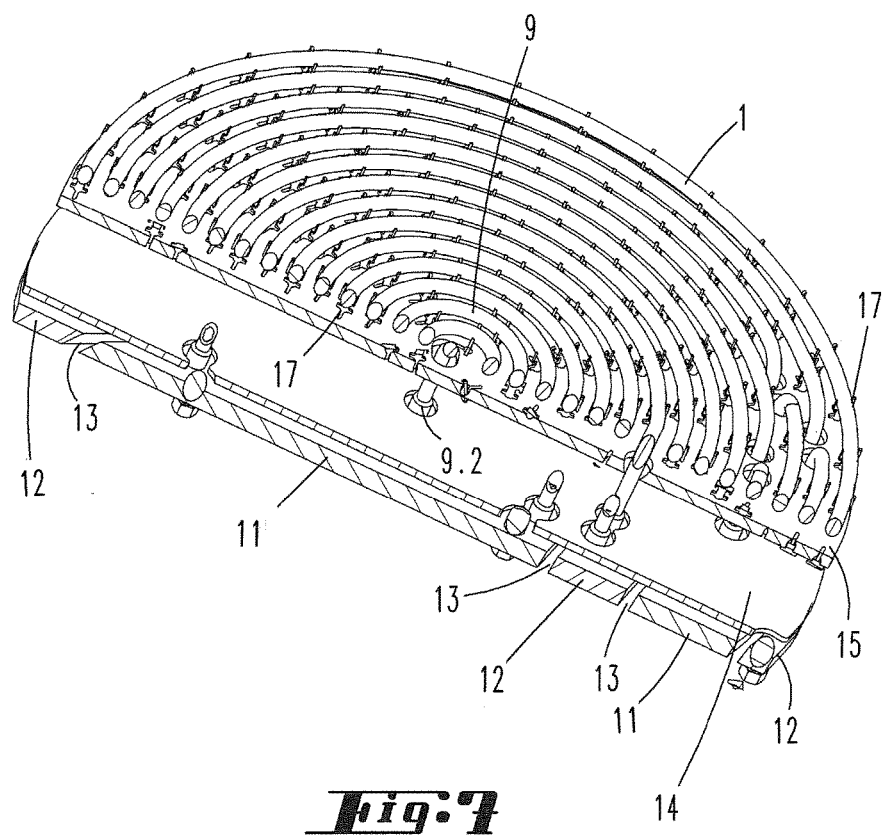
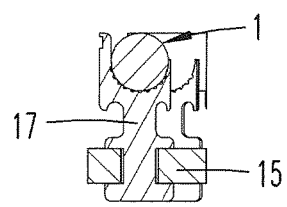
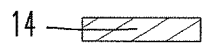

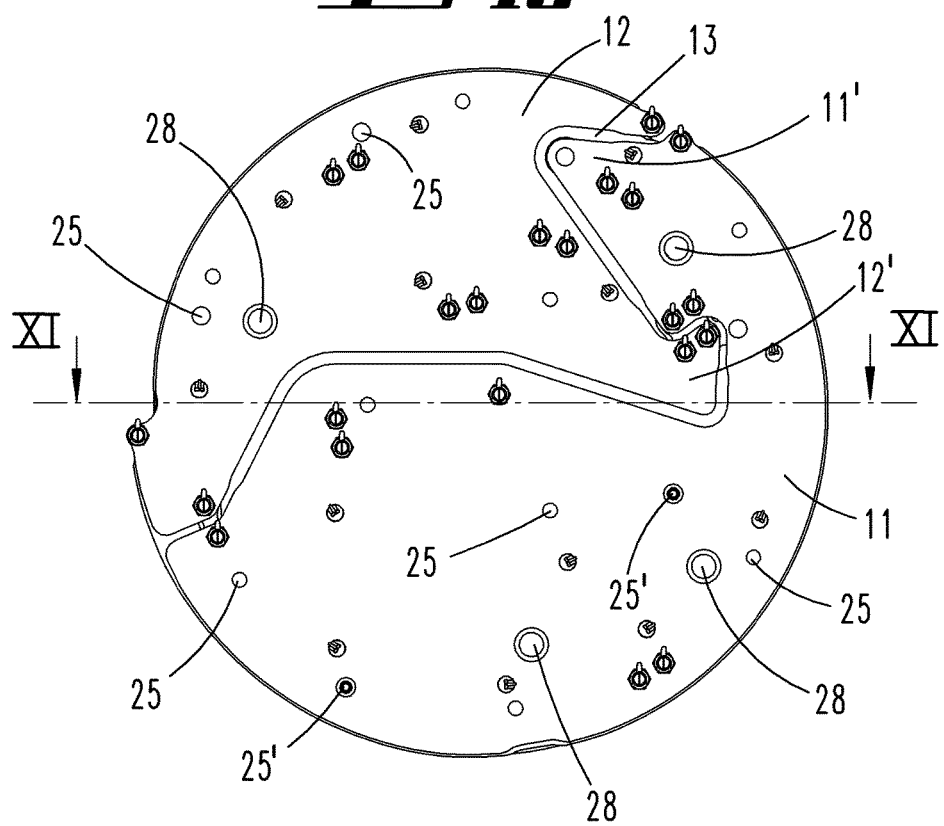
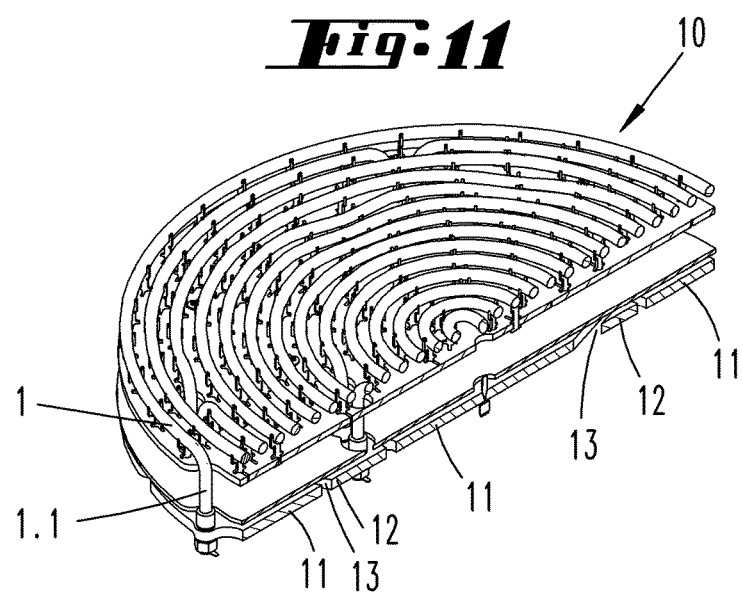

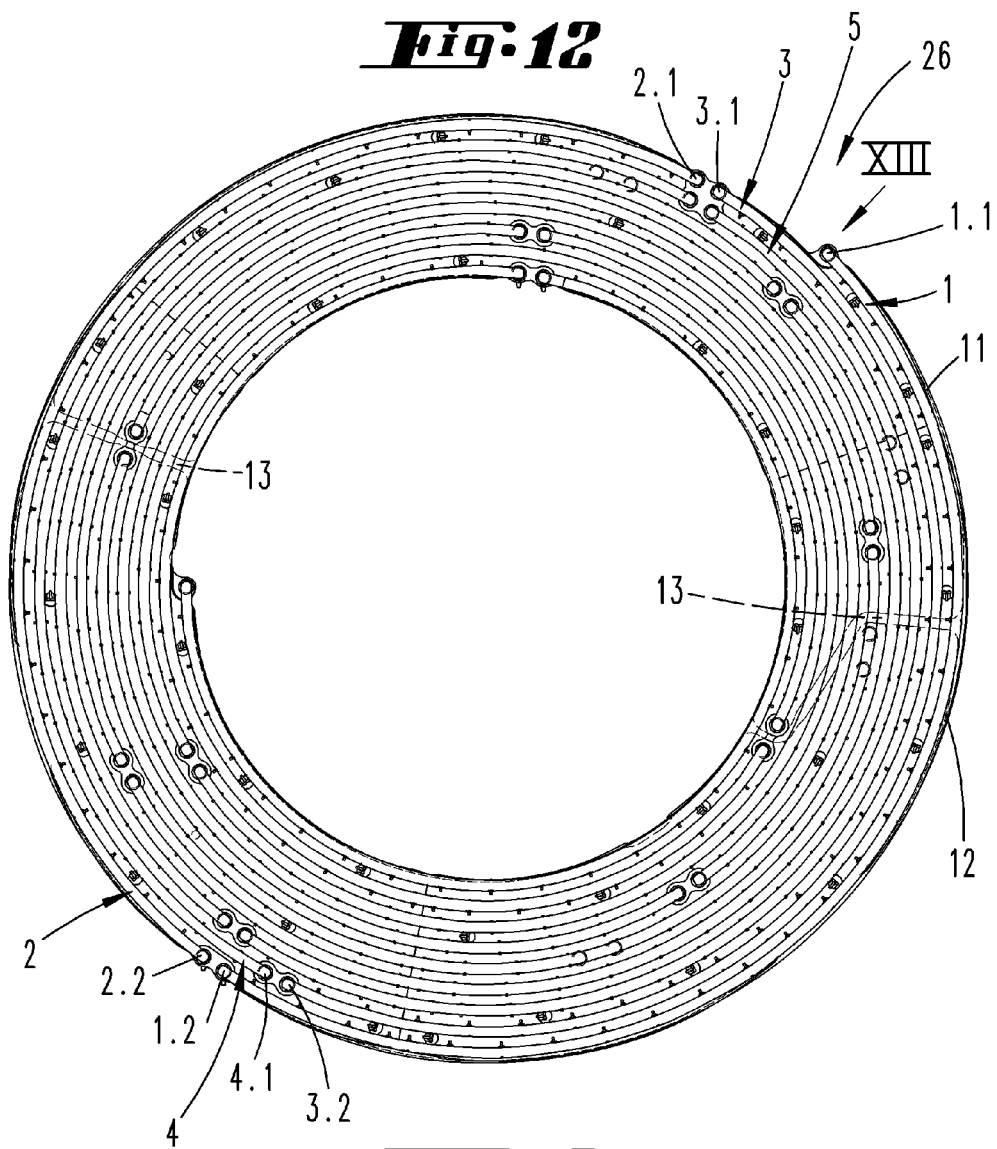
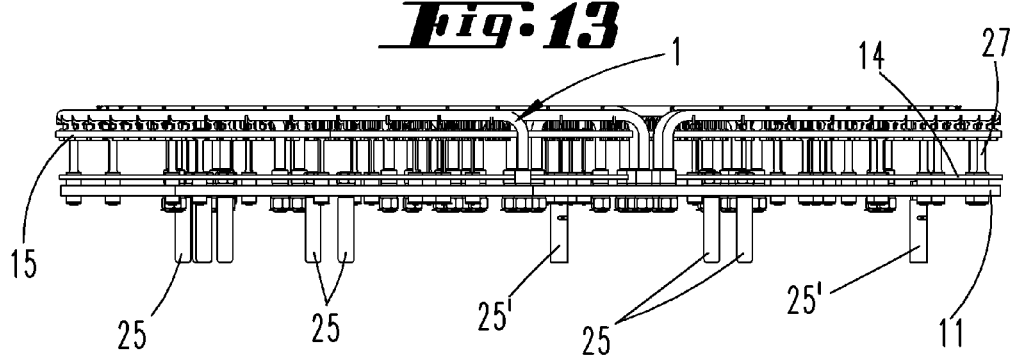

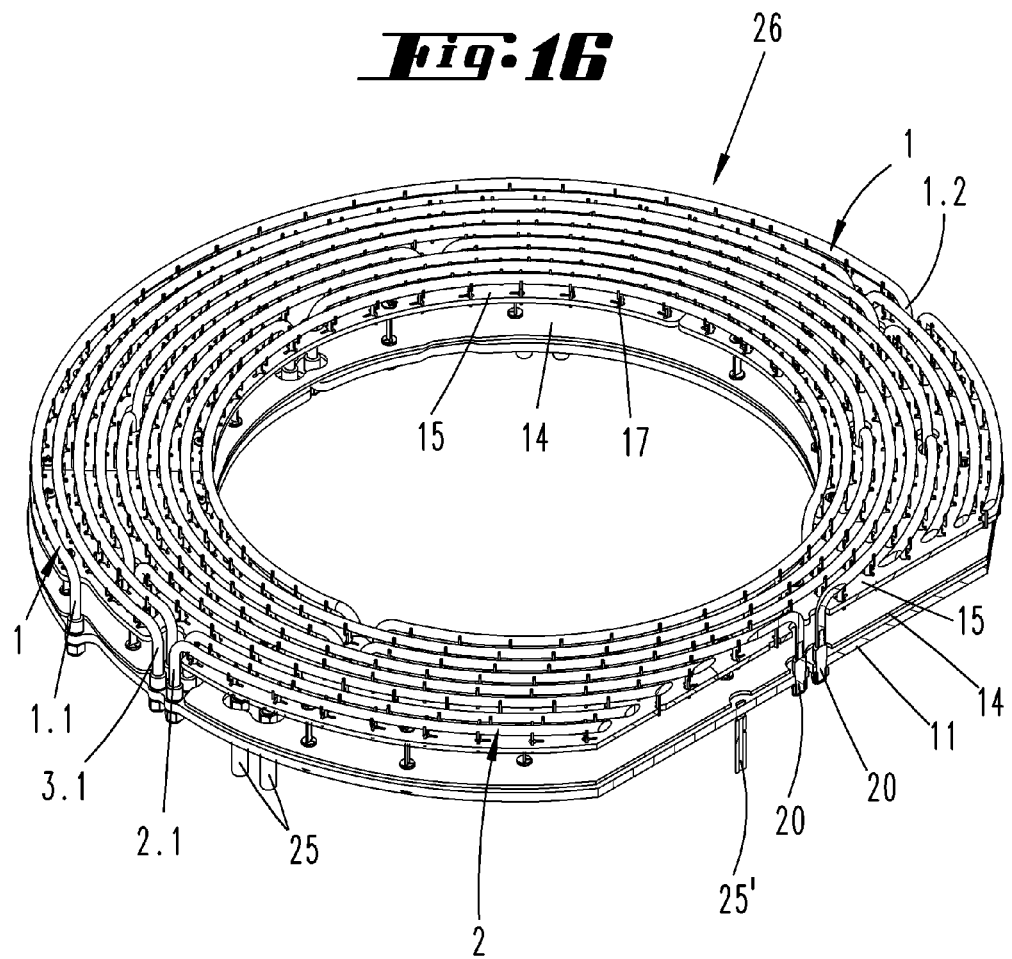

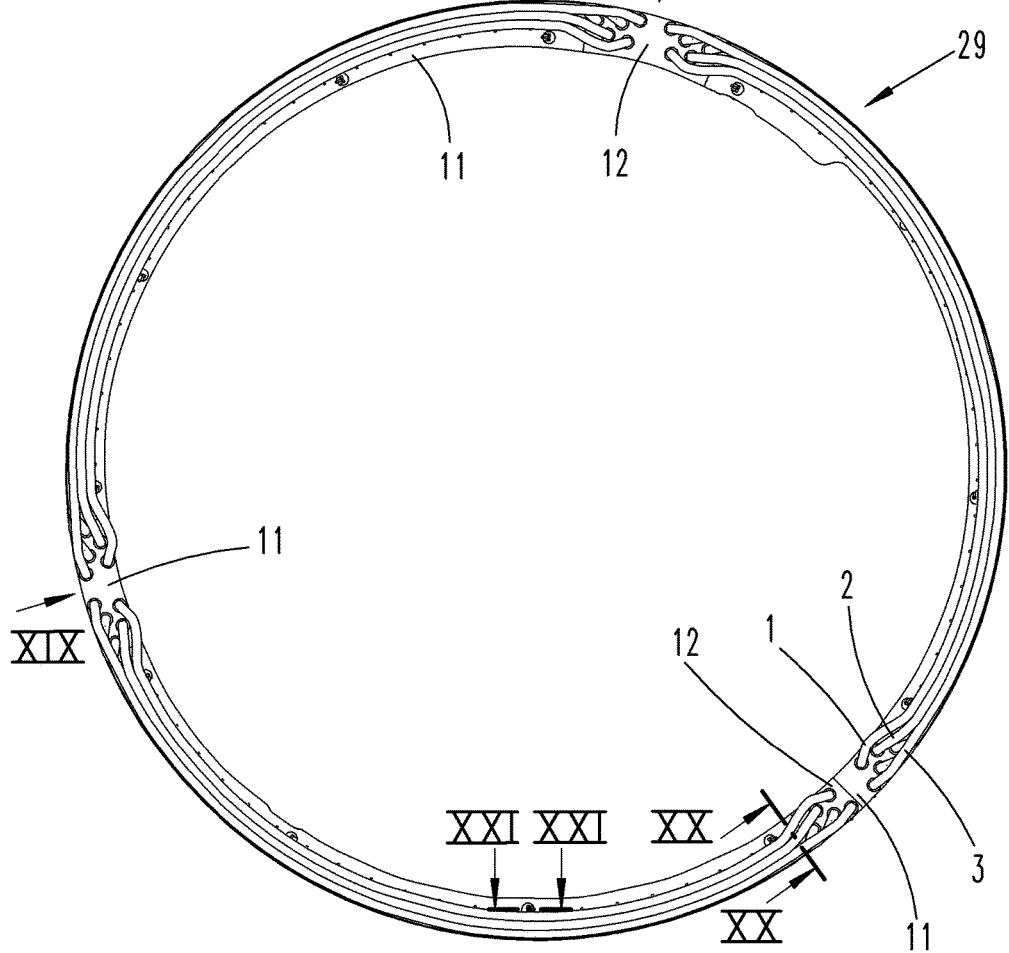
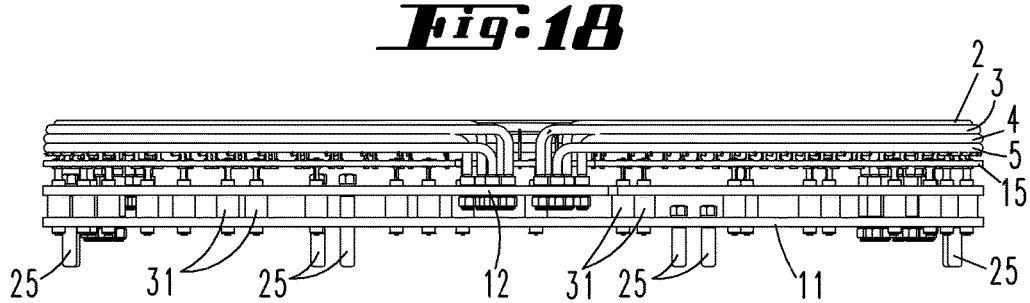

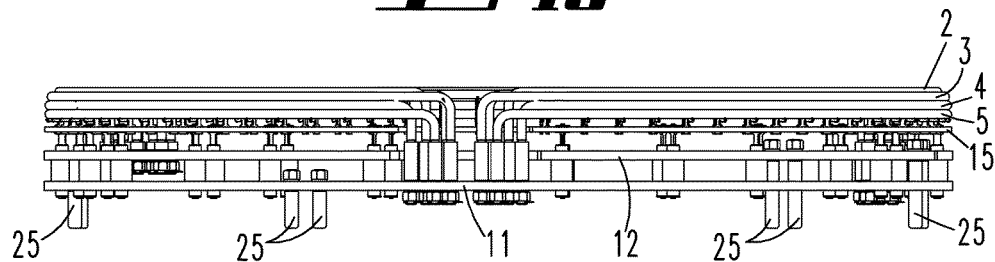
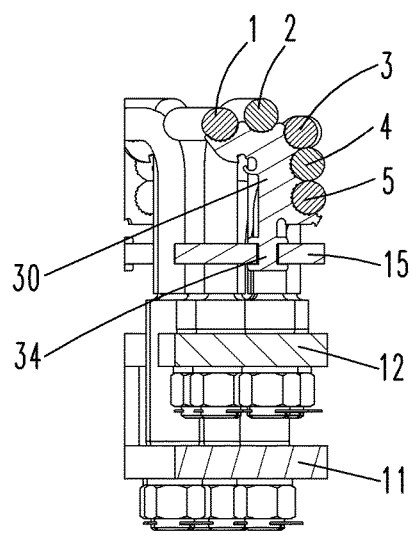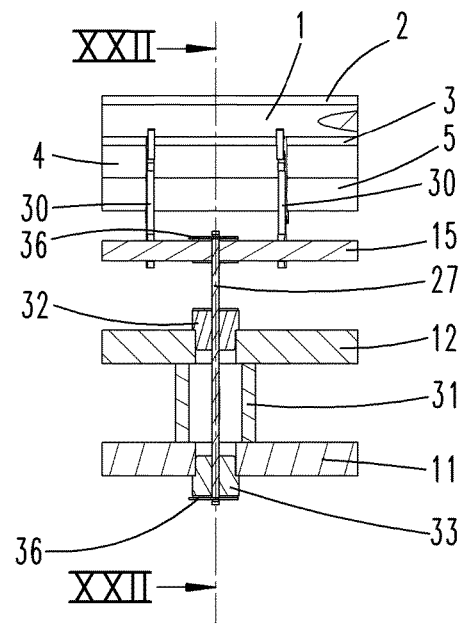

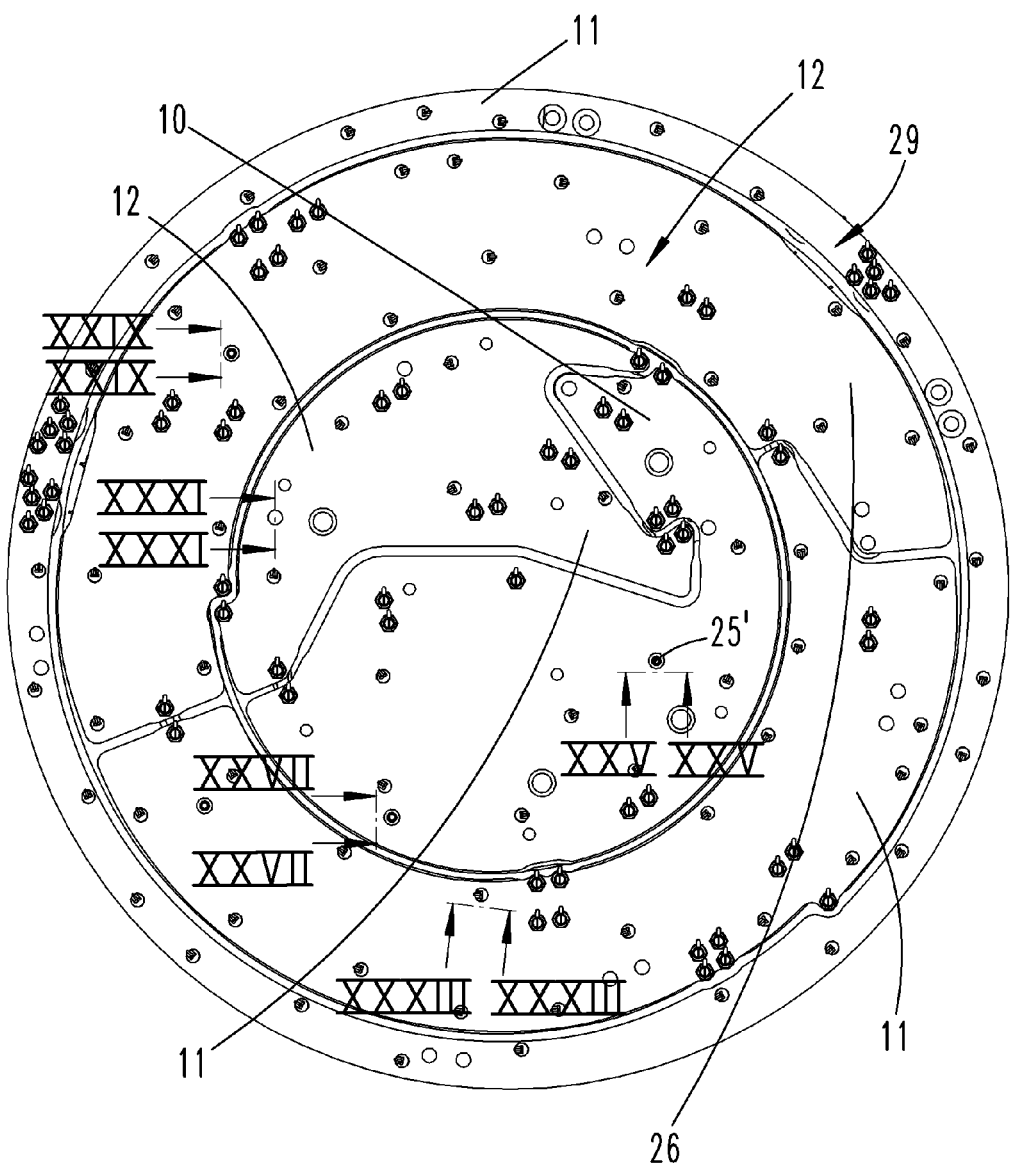

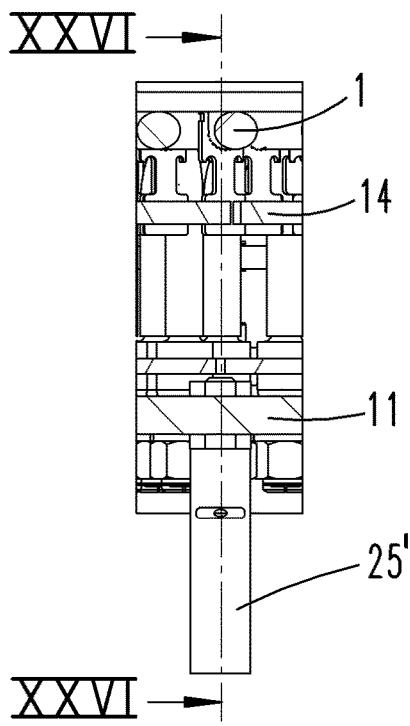
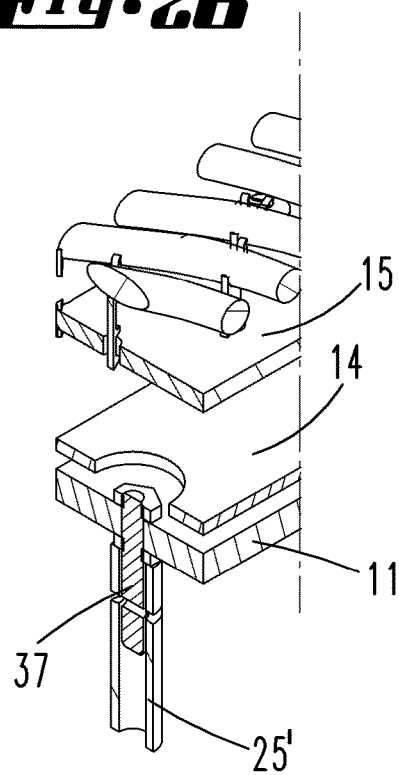
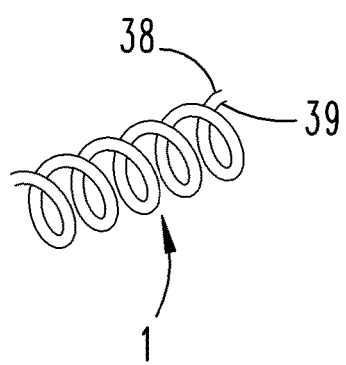

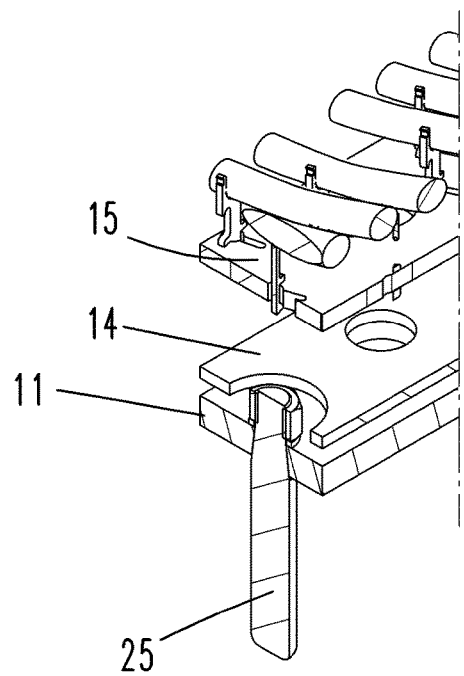

HEATING DEVICE

RELATED APPLICATIONS

This application is a National Stage under 35 USC 371 of and claims priority to International Application No. PCT/EP2014/074552, filed 14 Nov. 2014, which claims the priority benefit of DE Application No. 10 2013 113 045.3, filed 26 Nov. 2013.

FIELD OF THE INVENTION

The invention relates to a device with at least one first electrically conductive contact plate and with at least one second electrically conductive contact plate, and with a plurality of electrically parallel-connected first heating elements each with at least one resistance heating unit, wherein each of the heating elements is connected with the first contact plate by means of a first terminal contact, and with the second contact plate by means of a second terminal contact, wherein the two contact plates lie in a shared first plane, wherein the resistance heating units are arranged along a spiral or circular arc line around a center of the device.

BACKGROUND

US 2005/0 045 618 A1 describes such a device. The individual heating elements each extend over a full circle. Devices with heating elements that meander in a plane are shown in US 2004/0 149 227 A1, US 2010/0 162 956 A1 and U.S. Pat. No. 5,063,031.

US 2006/0 185 595 A1 describes linear heating elements that are electrically parallel connected, wherein the heating elements and contact plates allocated thereto run in a shared plane.

A U-shaped heating element is described in DE 75 18 153 U.

Devices for heating the susceptors of CVD reactors are also known from DE 10 2009 043 960 A1, DE 10 2007 009 145 A1, DE 103 29 107 A1, DE 10 2005 056 536 A1, DE 10 2006 018 515 A1 or DE 10 2007 027 704 A1.

In a known heating element, heat is generated by a current flowing through a resistance heating unit. The resistance heating unit has a first and a second end, where first and second terminal contacts are located. The terminal contacts run parallel to each other, but vary in length. The first, shorter terminal contact is connected with a first contact plate consisting of an electrically conductive material. A second electrical contact plate runs in a parallel plane to the first contact plate, but at a greater distance from the resistance heating unit. The two electrical contact plates extend one over the other, as it were. The longer second terminal contacts are passed through openings in the first contact plate, and are connected with the second contact plate. The openings through which the second terminal contacts pass are larger than the diameter of the second terminal contacts, thus leaving a distance between the edge of the opening and the second terminal contacts. This free space isolates the second terminal contact from the first contact plate. Significant thermal stresses arise while heating or cooling the resistance heating units of the heating elements in prior art. These mechanical stresses can lead to an irreversible deformation of the contact plates. As a result, short circuit bars form between the second terminal contacts and the openings of the electrically conductive first contact plate after prolonged use, and in particular after repeated heating and cooling. As a rule, this then results in the destruction of the entire heating element. The metal evaporating in the process can also contaminate the processing chamber of the CVD reactor in which the device is used.

SUMMARY OF THE INVENTION

The object of the invention is to increase the service life of the device while reducing manufacturing costs.

The object is achieved by the invention indicated in the claims.

According to the invention, the two contact plates now lie in a shared plane. The contact plates can exhibit extensions, which intermesh in a comb-like manner. A free space serving as isolation can be provided between the contact plates, and in particular between the extensions. However, it is also provided that the two contact plates be permanently isolated from each other by nonconductive, in particular ceramic spacing means. In addition, the advantage to the further development according to the invention is that the two terminal contacts can be the same length. The one or more resistance heating units can lie in a shared plane. They can be arranged along circular arc lines or along one or more spiral lines. Preferably located in the middle of a contact plate array comprised of two contact plates and exhibiting a circular arc outline is a first terminal contact, which preferably is allocated to a central heating element. The central heating element has a heating unit that extends on a spiral arc line. The central heating element forms an innermost heating zone of the heating device. The heating unit of the central heating element is adjoined by several heating units of outer heating elements that each preferably extend over at least 180°. A plurality, but preferably all, of the heating units lie on a shared spiral arc line that winds repeatedly around a center. The terminal contacts of two heating elements lying one after the other on a spiral arc line are situated one right next to the other, and allocated to a shared contact plate. As a result, a plurality of heating elements, e.g., nine heating elements, are parallel connected in terms of circuitry. The heat output of the individual heating elements can be determined by the length of their heating units. If the heating elements are intended to each deliver the same heat output, it is provided that the arc lengths of the heating units of the individual heating elements be essentially the same. As a consequence, it is provided in particular that the individual heating elements of the heating device have heating units with essentially the same arc length. This increases the service life of the device on the one hand, and lowers manufacturing costs on the other. A further development of the invention provides that the terminal contacts project from the shared first plane in the direction of the surface normal. The terminal contacts thus project in the direction of the second plane in which the resistance heating units are located. This plane forms a heating plane, from which the plane of the contact plates is spaced apart. A support plate can be arranged between the heating plane and the plane of the contact plates. The support plate can exhibit support elements that are connected with the heating units. This keeps the heating units in position relative to each other. The support elements can essentially be Y-shaped. The two Y-legs hold the heating unit. The heating unit preferably exhibits a circular arc cross section, and lies between the two Y-legs. The Y-web is rigidly joined with the support plate. The support elements can be punched out of sheet steel, and positively inserted into a respective opening in the support plate. Each support element can have two mutually parallel running arms, between which the heating unit with a round cross section is held. An arm that faces further outward relative to the center of the device can be longer than the inwardly facing arm. As a whole, the support element is fork-shaped, wherein the floor of the free space between the two fork arms is adjusted to the outline contour of the heating unit. However, the support element can also be j-shaped. It is further provided that the support element have only one arm. The heating element can be joined with the support element by one or more wires. The support plate is made out of a nonconductive material. The support elements can consist of metal. However, the support plate can also consist of a metal, and act as a shielding plate. It surface facing the heating elements is then heat reflecting. The electrically conductive support elements can be joined with the support plate via isolating bodies. The heating elements are preferably made out of tungsten or a tungsten alloy. Each heating element can consist of a filament. The filament is a wire wound in helical turns around the circular arc-shaped extension direction of the heating element. Two tungsten filaments running side by side and electrically parallel connected are preferably provided. The two filaments are coiled into twin filaments. However, it is also possible to bring more than two filaments into a shared helical shape, so as to thereby create a heating element that exhibits a triple filament.

A cover plate can also be provided. The latter can be located directly above the contact plates, specifically in the spacing gap between the heating plane and the plane of the contact plates. The cover plate has openings that extend through the terminal contacts. The cover plate consists of a nonconductive material. More than two contact plates can be provided, in particular if several different heating units are to be energized separately from each other, so that various zones of the device can be heated to different temperatures. In particular, the heating device is a constituent of a CVD reactor. The CVD reactor has a reactor casing that incorporates a gas inlet unit, with which process gases can be introduced into a processing chamber. The processing chamber has a floor comprised of a susceptor, which has arranged on it one or more substrates to be coated by introducing the process gas. The heating element described above is used to heat the processing chamber or susceptor to a process temperature. The heating element is situated under the susceptor in such a way that the heating plane is arranged parallel to the upper side bearing the substrates or parallel to the lower side of the susceptor. An optimal arrangement of terminal contacts in the plane of the contact plates is enabled by having each contact plate exhibit bulges that engage into recesses of the respective other contact plate. As a consequence, the contact plates engage into each other in a comb-like manner. The resultantly formed contact extensions carry terminal contacts.

A susceptor of a CVD system is preferably heated with a heater that exhibits several heating zones. Each heating zone is preferably comprised of a heating device allocated thereto. A device in one variant of the invention has several heating devices, wherein a central heating device is enveloped by at least one, preferably three or more heating devices. The central heating device preferably has an annular outline. Another radially outer heating device enveloping the central heating device has an annular outline. Additional external heating devices can also exhibit an annular outline. At least one of the heating devices lying radially outward preferably exhibits two contact plates, which are arranged in a shared plane, and galvanically separated from each other and from the contact plates of the remaining heating devices. The at least two heating devices can be energized separately from each other. The heating elements of the two heating devices can also lie in a shared plane. One variant of the invention provides an outermost heating device, in which a contact plate lies in a first plane, and a second contact plate lies in a second plane. The planes are spaced apart from each other. The radially outermost heating device can have one or more heating elements lying above the plane that accommodates the heating elements of the inner heating devices or at least one central heating device. The heating elements of the radially outermost heating device can lie adjacent to each other so tightly as to come into contact with each other. In particular, the radially outermost heating device provides that the support elements carry several heating elements simultaneously. The adjacently running heating elements are carried by support elements at several locations. If the support elements are made out of metal, the heating elements are also electrically connected with each other at several locations by the support elements. Connecting elements are provided that in particular spatially have isolating elements allocated to them. The connecting elements can connect the contact plate with a cover plate or with a support plate. This preferably is done by positively coupling the connecting elements with the contact plates. Contact pins used for introducing current can project from the contact plates.

An exemplary embodiment of the invention will be explained below based on the attached drawings. Shown on:

BRIEF DESCRIPTION OF THE DRAWINGS

FIG. 2: is a top view of a heating device according to the invention in a first exemplary embodiment,
FIG. 3: is a side view of the heating device depicted on FIG. 2,
FIG. 4: is a bottom view of the heating device,
FIG. 5: is a perspective view of the heating device,
FIG. 6: is a section along the VI-VI line on FIG. 5,
FIG. 7: is a section along the VII-VI line on FIG. 2,
FIG. 8: is a top view of a heating device in a second exemplary embodiment,
FIG. 11: is a three-dimensional depiction of the section along the XI-XI line on FIG. 10,
FIG. 12: is a top view of a third exemplary embodiment of the invention,
FIG. 13: is a side view according to the XIII arrow on FIG. 12,
FIG. 14: is a bottom view of the exemplary embodiment depicted on FIG. 12 in a top view,
FIG. 18: is a side view according to the XVIII arrow on FIG. 17,
FIG. 19: is another side view according to the XIX arrow on FIG. 17,
FIG. 20: is a section along the XX-XX line on FIG. 17,
FIG. 21: is a section along the XXI-XXI line on FIG. 17,
FIG. 22: is a section along the XXII-XXII line on FIG. 21,
FIG. 23: is a three-dimensional depiction of a section through a connecting element,
FIG. 24: is a bottom view of three heating devices assembled into a multi-zone heater,
FIG. 25: is a section along the XXV-XXV line on FIG. 24, FIG. 26: is a section along the XXVI-XXVI line on FIG. 25, FIG. 27: is a depiction of a heating element consisting of two filaments coiled around the extension direction of the heating element,

DETAILED DESCRIPTION

Figure 28:
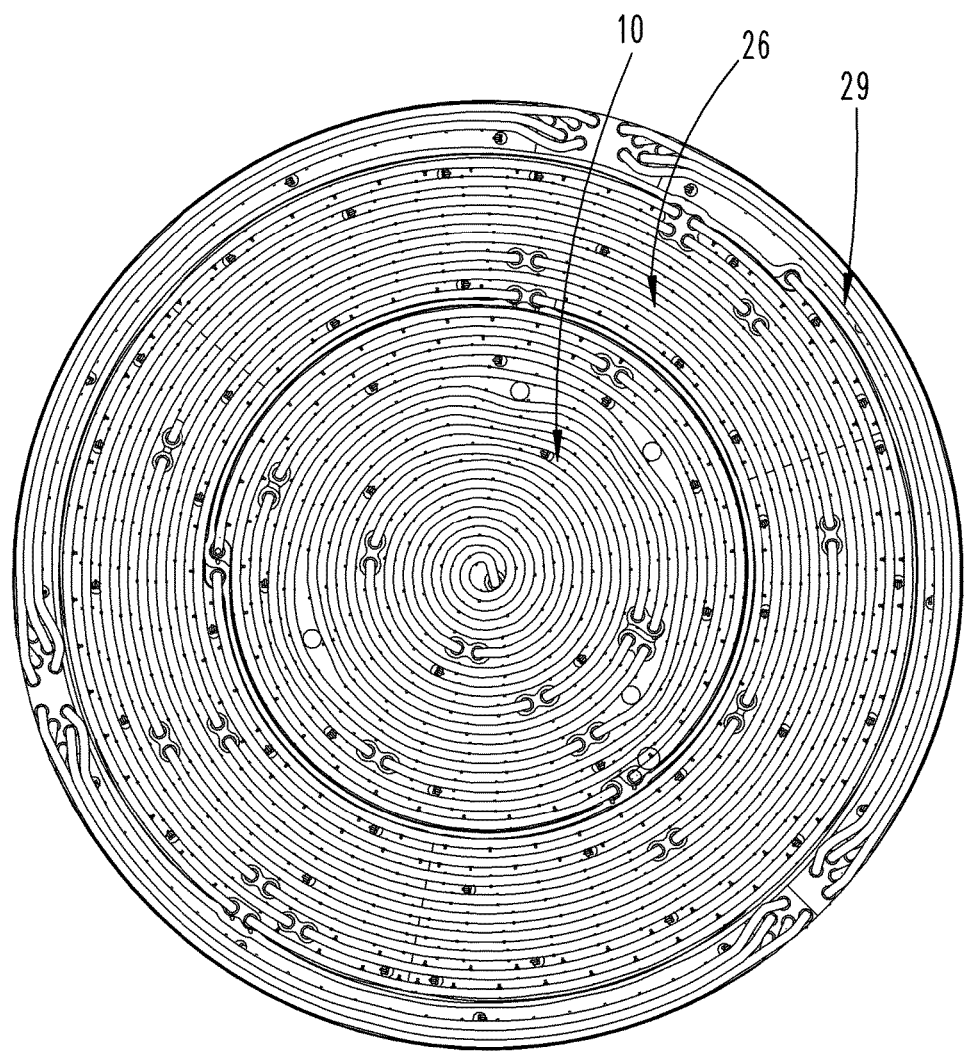

FIG. 28: is a top view of the multi-zone heater depicted on FIG. 24 in a bottom view, and FIG. 29: is a section through the heating device to illustrate a conical abutment surface of a contact pin against a conical wall of an opening of a contact plate.

Figure 1:
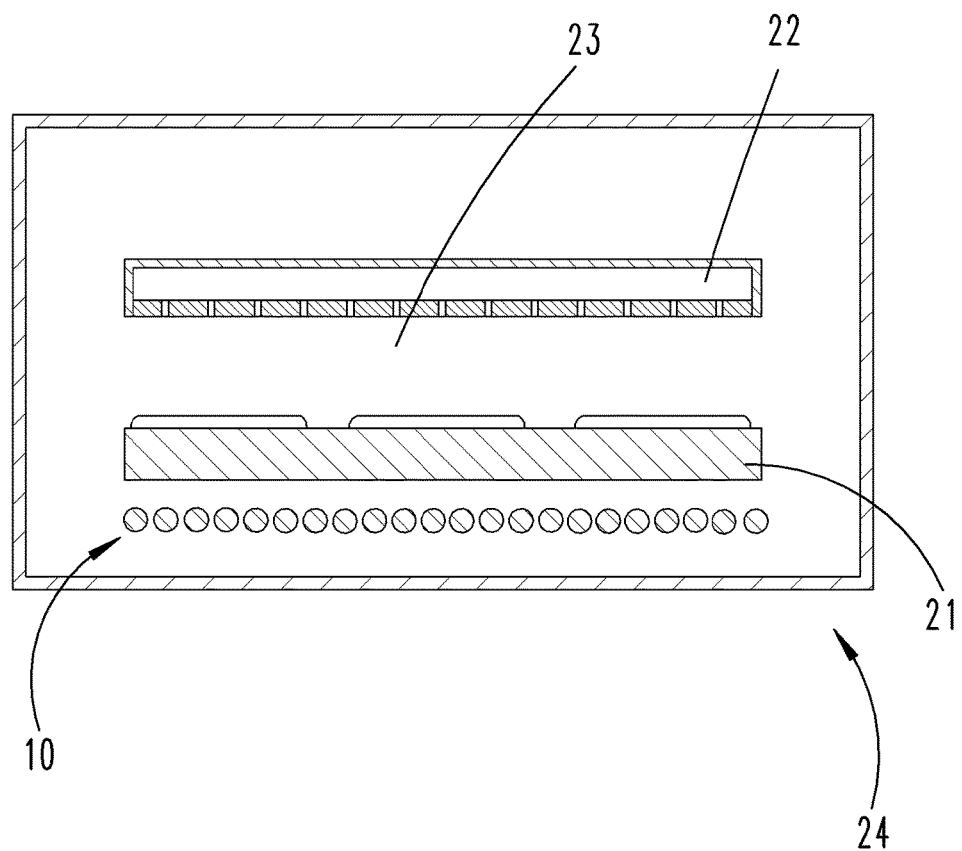
FIG. 1: is the schematic structure of a CVD reactor.
Figure 8:
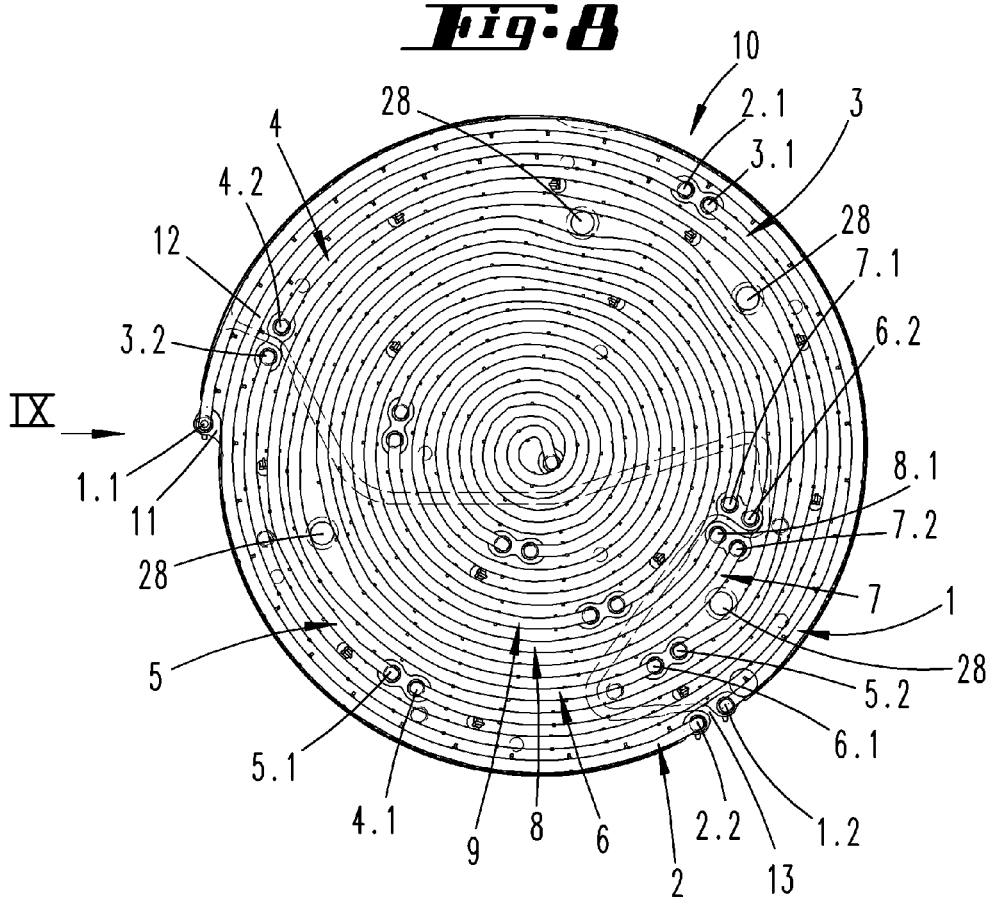
Figure 9:
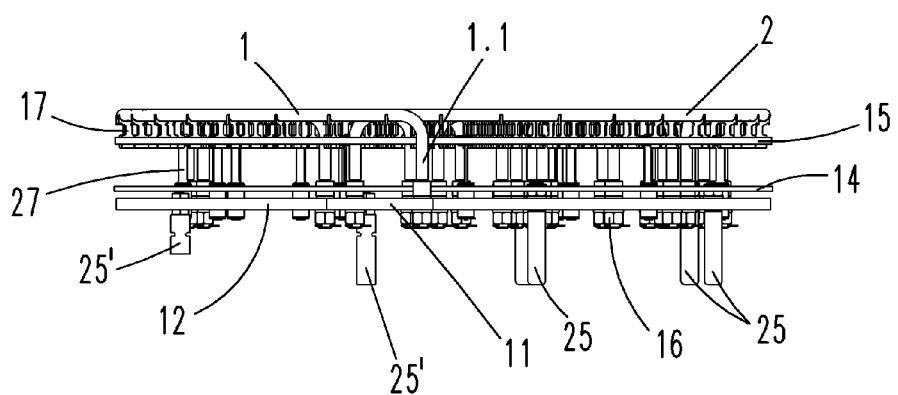
FIG. 9: is a side view according to the IX arrow on FIG. 8,
FIG. 10: is a bottom view of the exemplary embodiment depicted on FIG. 8 in a top view.
Figure 14:
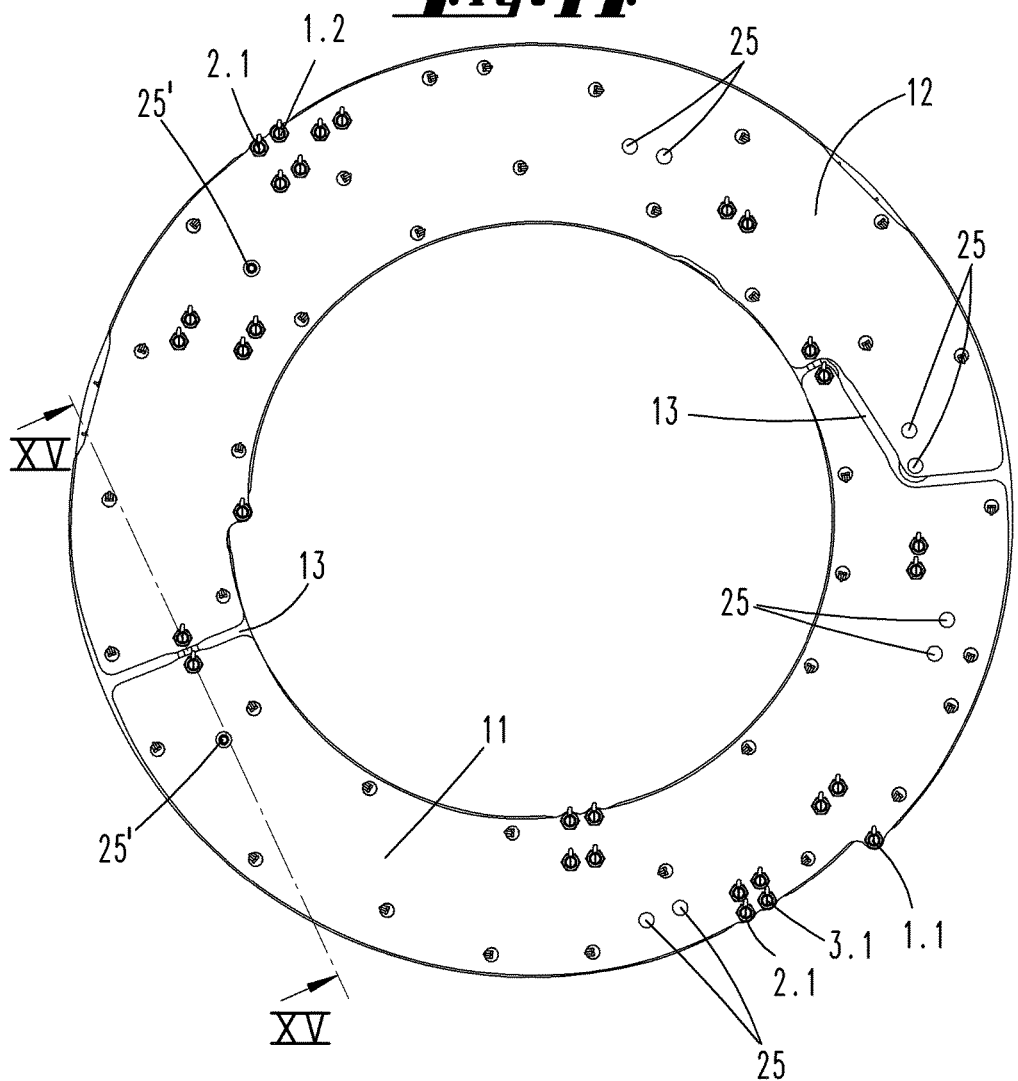

The heating device according to the invention is preferably a constituent of a CVD reactor of the kind schematically depicted on FIG. 1. The CVD reactor has a reactor casing 24, which incorporates a gas inlet unit 22 through which the process gas is introduced into a process chamber 23 situated under the gas inlet unit 22. The floor of the process chamber 23 consists of a susceptor 21, which carries coated substrates. Located under the susceptor 21 is a heating device 10, which exhibits several heating zones.

The heating device 10 only depicted schematically on FIG. 1 is shown in detail on FIGS. 2 to 6.

The heating device has a total of 9 heating units 1.3 to 9.3. The heating units 1.3 to 9.3 are arranged on a spiral line in a plane E2. The heating units 1.3 to 9.3 have essentially the same uniform length. However, the length of the heating units 1.3 to 9.3 can also differ individually if the heating units 1.3 to 9.3 are to deliver varying heat outputs.

Each heating unit 1.3 to 9.3 with a circular cross section is comprised of a heating element 1 to 9. The heating units 1.3 to 9.3 are depicted as round bodies arranged on a spiral arc path on the drawings. This is one embodiment variant for the heating units 1.3 to 9.3. In a preferred embodiment of the invention, however, the heating elements 1.9 to 9.3 are each made out of one or more wires, so-called filaments. One or more wires are wound in helical turns around the center lines of the spiral lines, thereby yielding a hollow body with a circular cross section, whose jacket wall consists of the helical turns of the filaments.

Heating elements 1 to 9 form heating zones nestled coaxially into each other. A central heating element 9 forms a central heating zone. A terminal contact 9.2 of the heating element 9 is located in about the center of the heating device exhibiting a circular outline. The terminal contact 9.2 is connected with a contact plate 12. Another terminal contact 9.1 is connected with a contact plate 11 radially outside the center. The contact plate 11 is a first contact plate, with which is connected a respective first contact 1.1, 2.1, 3.1, 4.1, 5.1, 6.1, 7.1, 8.1, 9.1 of the heating elements 1 to 9. The respective second terminal contacts 1.2, 2.2, 3.2, 4.2, 5.2, 6.2, 7.2, 8.2, 9.2 are connected with the second contact plate 12. The first contact plate 11 and second contact plate 12 consist of an electrically conductive material, for example a metal, and are connected with the respective terminal contacts 1.1 to 9.2 in an electrically conductive manner.

Terminal contacts 1.1 to 9.2 project in the direction of the surface normal, i.e., perpendicular to the surface of the contact plates 11, 12. The first terminal contacts 1.1 to 9.1 have the same length as the second terminal contacts 1.2 to 9.3. As a consequence, the two contact plates 11, 12 lie in a shared plane E1. The heating units 1.3 to 9.3 from which the terminal contacts 1.1 to 9.1 or 1.2 to 9.2 project at a right angle lie in a second plane E2.

As evident from FIGS. 2 and 4, two terminal contacts always lie one next to the other in pairs in a preferred exemplary embodiment. Involved here are either first terminal contacts connected with the first contact plate 11, or respective second terminal contacts, which are connected with the second contact plate 12.

The two contact plates 11, 12 are spaced apart from each other by an isolating gap 13. The isolation gap 13 is large enough to allow the contact plates 11, 12 to move slightly while heating or cooling the heating device, without hitting each other so as to generate a short circuit or allowing an arc to form over the isolation gap 13. The spacing gap 13 runs on an arc-shaped line. This yields tongue-like contact extensions 11', 12', which engage into coves of the respective other contact plate 11, 12.

The heating elements 1 can consist of metal. The terminal contacts N.1 or N.2 are integrally molded onto the respective heating unit N.3 of the respective heating element. The free end of each terminal contact N.1, N.2 has a foot 20, which is thickened and abuts against the contact plate 11, 12. A threaded section projecting from the foot 20 engages through an opening of the contact plate 11, 12. A nut 16 is screwed onto the threaded section.

Provided is a support plate 15 comprised of an electrically nonconductive material, e.g., ceramic material, which is located in the space between the first plane E1 and second plane E2. The support plate 15 is situated directly under the heating unit N.3, and is connected by a plurality of support elements 17 with the individual heating units N.3. This keeps the heating units N.3 on a spiral line. The terminal contacts N.1 and N.2 penetrate through openings 19 in the support plate 15.

The Y-shaped support elements can be made out of metal. Their Y-webs are inserted into fastening openings of the support plate 15. The two Y-legs project upwardly. The Y-legs can project parallel to each other. They accommodate the heating unit between them. FIG. 7 shows a section through a support element, and hence its outline contour. A spacing web extending between the heating unit and support plate 15 holds the heating unit at a defined distance to the support plate 15. The support element 17 made out of a punched part is positively inserted into an opening of the support plate 15. The heating unit 1 lies between two arms of the support element 17, wherein the free space between the two arms is adjusted to the outline contour of the heating unit. The radially outer arm is longer in design than the arm lying radially inside. Provided is a cover plate 14 consisting of molybdenum, which is located directly above the two contact plates 11, 12 lying in a shared plane E1. It is made out of a nonconductive material, e.g., a ceramic material, and has openings 18 lying at the height of the feet 20 of the terminal contacts N.1, N.2. The terminal contacts N.1 and N.2 are guided through these openings 18.

In an exemplary embodiment not shown, more than two contact plates 11, 12 are provided. As a result, different heating elements 1 to 9 can be variably energized. In the heating device shown in the exemplary embodiment, the heating units N.3 of the heating elements 1 to 9 are each parallel connected to each other. The heat output emitted by the individual radial zones to the susceptor 21 essentially depends on the length of the heating unit N.3.

In the exemplary embodiment, a plurality of heating elements lie on a spiral curve. However, the heating elements can also lie on circular arc lines nestled into each other. Further, the heating elements can also be arranged on several spiral curves nestled into each other.

The heating device shown on FIGS. 2 to 7 can be a central heating device of a multi-zone heater. FIGS. 8 to 11 show a further exemplary embodiment for a central heating device 10 of a multi-zone heating system.

The heating system has a plurality of heating elements 1 to 9 arranged one after the other on a spiral line around a center of a circular base area. In this exemplary embodiment, the individual heating elements 1 to 9 do not all extend over at least one 360 degree arc. They are shorter in design than in the first exemplary embodiment. However, the total number of heating elements in the second exemplary embodiment is higher than in the first exemplary embodiment. The heating elements 1 to 9 lie next to each other spaced essentially a constant distance apart, wherein the distance between two adjacently running heating elements is somewhat enlarged at some locations, since the respective contact plate 11, 12 here provides an opening 28 through which the plungers can pass so as to be able to lift the susceptor 21.

The individual heating elements 1 to 9 are each formed by one or two filaments 38, 39. As shown on FIG. 27, the filaments are shaped into a helical run. Two filaments 38, 39 run adjacently at about a constant distance on a helical run line around the extension direction of the heating element.

In the exemplary embodiment shown on FIGS. 8 to 11, all heating elements 1 to 9 lie in a shared plane extending parallel to a support plate 15. However, it can also be provided that the radially outermost heating element run on a lower level, i.e., lie closer to the plane of the contact plates 11, 12, than the heating elements lying radially inside.

The heating elements 1 to 9 are held in a plane parallel to the plane of the support plate 15 by means of support elements 17. The feet of the support elements 17 are anchored in the support plate. To this end, positively locking elements are provided that grip the support plate 15 from above and below.

Connecting elements 27 are used to join the support plate 15 with a plate 14. The plate 14 can be made out of metal or ceramic. The support plate 15 is preferably made out of metal, and thus functions as a shield against thermal radiation due to its reflecting action.

The plate 14 is joined with the contact plates 11, 12 via isolating connecting elements. This keeps the contact plates 11, 12 spaced apart from each other, thereby yielding a gap 13 between the contact plates 11, 12 that electrically isolates the two contact plates 11, 12 from each other. A plurality of contact pins 25 project from the rear side of the contact plates 11, 12, and can have secured to them contact terminals so as to energize the heating elements 1 to 8. All heating elements 1 to 9 have the same arc length, meaning the same ohmic resistance, and are electrically parallel connected.

The exemplary embodiment depicted on FIGS. 12 to 16 essentially only differs from the previous exemplary embodiments in terms of the base area. The base area is here also circular, but its center has an opening, the size of which is dimensioned in such a way that the exemplary embodiment shown on FIGS. 8 to 11 can be placed into the central free space. The heating device 26 shown on FIGS. 12 to 16 thereby forms a heating zone of a multi-zone heater. If the multi-zone heater only consists of two heating devices, e.g., the heating device shown on FIGS. 8 to 11 and on FIGS. 12 to 16, it forms an outer heating zone of a two-zone heater.

Several contact plates 11, 12 are provided. Involved are two contact plates 11, 12 separated from each other by a gap 13. Several heating elements 1 to 9 extend on a single spiral arc line around the center of the base area. The heating elements 1 to 9 have the same length, and are electrically parallel connected. The contact plates 11, 12 have contact pins 25, which each project from the rear side of the contact plates 11, 12. These contact pins 25 are connected with each other using clamping terminals (not shown) or inserted into contact jacks, so as to individually supply the contact plates 11, 12 with electrical energy. As a consequence, the heating device 26 can be individually energized in relation to the heating device 10.

Figure 15:
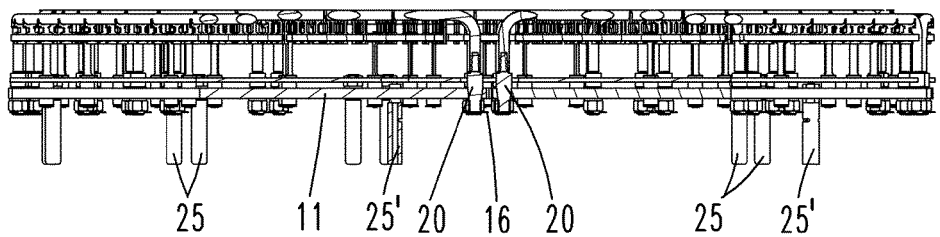
FIG. 15: is a section along the XV-XV line on FIG. 14,
FIG. 16: is a three-dimensional depiction of the section along the XV-XV line on FIG. 14,
FIG. 17: is a top view of a fourth exemplary embodiment of the invention.

FIGS. 15 and 16 show a special configuration of feet 20, with which the heating elements 1 to 9, i.e., the airing filaments 38, 39, are connected with the contact plate 11, 12. The contact plate 11, 12 has conical boreholes, into which the conical sections of the feet 20 enter. A nut 16 is screwed onto a threaded section of the foot 20, drawing the conical surface of the foot 20 into contact with the wall of the conical opening over a large surface. The nut 16 is secured against rotation by a locking pin. The threaded section adjoins a stub portion of a truncated cone. The locking pin can be inserted through a borehole of the threaded section. This borehole can also be brought flush with an opening in the wall of the nut 16, so that the locking pin penetrates through both the nut and threaded shank.

In the exemplary embodiment shown on FIGS. 15 and 16, the radially outermost heating element runs in a plane spaced less apart from the contact plates 11, 12 than the radially inner heating elements, and thus run in a plane spaced farther apart from the plane of the contact plates 11, 12 than the plane in which the radially outermost heating element is located. For this reason, the feet 20 by means of which the filaments of the heating elements forming the outermost winding are joined with the contact plates 11, 12 have a somewhat shorter design, i.e., the feet 20 by means of which the inner heating elements are joined with the contact plates 11, 12.

The exemplary embodiment depicted on FIGS. 17 to 23 exhibits a radially outermost heating zone. Several heating elements 1 to 5 here partially contact each other, running on a shared circular arc line. As opposed to the previously described exemplary embodiments, two annularly shaped contact plates 11, 12 here lie one over the other. Each contact plate 11, 12 can be energized via contact pins 25 facing away from the heating elements 1 to 5. The contact plates 11, 12 here lie in planes running parallel to each other and spaced apart from each other.

As opposed to the exemplary embodiments described above, in which a support element carries only one respective heating element, a support element 30 here carries a total of five heating elements. Since the support element 30 consists of metal, the heating elements 1 to 5 are connected with each other at the supporting points.

A foot 34 of the support element 30 engages through a slit 35 of the support plate 15. Webs projecting from the foot 34 are provided, and extend over the lower side and upper side of the support plate.

In this exemplary embodiment, the support plate 15 consists of a nonconductive material. The support elements 30 form trough-shaped recesses, wherein each of the trough-shaped recesses exhibits a ribbed edge. The filaments 38, 39 depicted as solid bodies on FIGS. 20 to 23 for purposes of clarity are laid out on this ribbed edge.

As evident from FIG. 20, the heating elements 1 to 5 do not run in a shared plane. Rather, the heating elements lie in varying planes. The heating elements 1 to 5 are each spaced a different distance apart from the support plate 15 or contact plates 11, 12. The heating element 2 that extends radially outside the heating element 1 is spaced farther apart from the support plate 15 than the heating element 1. The radially outermost heating elements 3, 4, 5 run at about the same distance from the center of the heating device 26, wherein the heating element 3 is spaced roughly the same distance away from the support plate as the heating element 1. However, the radially outermost heating elements 4, 5 are the most tightly adjacent to the support plate 15. As a consequence, the radially outermost heating elements 4, 5 lie in a deepest plane parallel to the plane of the contact plates 11 or 12.

Figure 22:
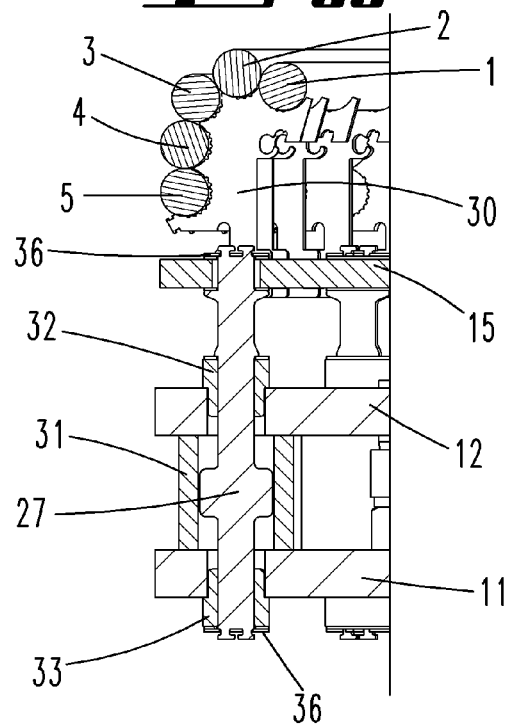
Figure 23:
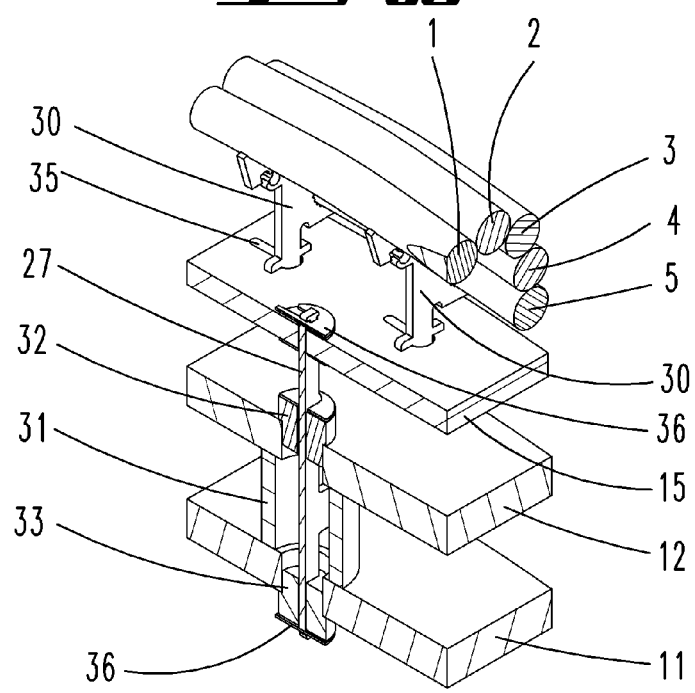

In addition, FIGS. 21 to 23 also show a connecting element 27, which connects the support plate 15 with the two contact plates 11 and 12. The connecting element 27 consists of a metal strip fastened in an opening of the support plate 15. The metal strip 27 engages through openings in the two contact plates 11, 12, and is there joined with the contact plate 11, 12 by means of a respective isolating body 32, 33. The contact plates 11, 12 are spaced apart by means of a spacer 31 made out of an insulating material. The spacer 31 is a ceramic sleeve that envelops the connecting element 27. Laterally projecting wings that can abut against the interior wall of the ceramic tube 31 are used to center the spacer 31 in relation to the connecting element 27. The isolating bodies 32, 33 are cylindrical ceramic bodies with a section having a reduced diameter. The section reduced in diameter is inserted into an opening in the contact plate 11, 12. The section with an enlarged diameter is supported against the broadside surface of the contact plate 11, 12. The center axis of the isolating body 32, 33 has a slit through which the connecting element 27 passes. As evident from FIG. 22, one step of the connecting element is supported against the isolating body 32, and the isolating head 33 is fastened to the connecting element 27 by means of a locking element 36, wherein the locking element 36 has a locking pin that is inserted through an opening in the connecting element 27.

The support plate 15 is carried by laterally projecting support arms of the connecting element 27. One section of the connecting element 27 engages through an opening in the support plate 15. A pin of a locking element 36 is there also inserted into an opening.

The locking elements 36 can consist of locking wafers, which exhibit a pin that can be inserted through a locking opening.

FIGS. 24 and 28 show the previously described heating systems 10, 26, 29 in an arrangement where they are used as a heater under a susceptor 21. The individual heating devices 10, 26, 29 are nestled into each other. While the heating elements 1 to 9 of the heating devices 10 and 27 run in a shared plane, the heating elements 1 to 5 lie partially above this plane, but also partially below this plane. The heating elements of the radially innermost heating device 10 all lie on a shared plane. The heating elements of the central heating device 26 also run in this plane, except for the heating elements situated in the radially outermost spiral coil. These radially outermost heating elements run on a lowered level, meaning that they are spaced farther apart from the susceptor lower side than the radially inner heating elements when in use. The heating elements of the radially outermost heating device 29 partially lie on a higher level than the heating elements of the central heating device 10. However, the radially outermost heating elements of the outermost heating device 29 lie on a lower level. In particular, it is provided that the individual heating elements lie more tightly adjacent to each other in the radially outermost heating device 29 than in the radially inner heating devices 10, 26. More heating elements per unit of radial length are situated in the outermost heating device 29 than in the two radially inner heating devices 10, 26.

As may also be gleaned from FIG. 13, not just a single radially outermost spiral coil runs on a lowered level. There are heating elements located on several radially outermost spiral coils that run on a lower lying level.

FIGS. 25 and 26 show specially configured contact pins 25', which are connected with the contact plate 11 in an electrically conductive manner via a threaded connection. A journal 37 fastened to a threaded section by means of a nut projects into a hollow journal 25'. A transverse opening in the journal 37 is here flush with a transverse slit of the hollow contact pin 25'.

Provided here as well is that the contact pins 25 abut against the conical walls of an opening in the contact plate 11 via a conical contact surface. This is depicted on FIG. 29, for example.

The above statements serve to explain the inventions encompassed by the application as a whole, and each separately further develop prior art by way of the following feature combinations, specifically:

A device, characterized in that the two contact plates lie in a shared first plane;

A device, characterized in that the heating unit is situated in a plane parallel to the first plane under a susceptor of a process chamber of a CVD reactor;

A device, characterized by terminal contacts 1.1 to 9.1, 1.2 to 9.2, running in the direction of the surface normal of the first plane, which extend at a 90° angle to the extension direction of the heating elements, wherein it is provided in particular that the resistance heating units 1.3 to 9.3 form an essentially 90° curve, or that the terminal contacts 1.1 to 9.2 are formed at a 90° angle;

A device, characterized in that the resistance heating units are situated along a spiral or circular arc line around a center of the device and/or that several heating units 1.3 to 9.3 are situated along the circular arc or spiral line, in particular lying one behind the other or nestled into each other;

A device, characterized in that the two contact plates 11, 12 are spaced apart from each other by a distance 13, wherein the distance 13 is comprised in particular of an air gap, wherein it is provided in particular that the two contact plates 11, 12 consisting of metal be kept a distance apart from each other by a spacer 31 formed out of an isolator, wherein in particular a connecting element 27 is allocated to the spacer 31;

A device, characterized in that the two first and second contact plates 11, 12 lying in a shared first plane E1 exhibit contact extensions 11', 12' that intermesh in a comb-like manner;

A device, characterized in that a respective two adjacently arranged terminal contacts 1.2, 2.2; 2.1, 3.1; 3.2, 4.2 . . . , 8.2, 9.2 are allocated to a shared contact plate 11, 12;

A device, characterized by a support plate 15 that is arranged parallel to the contact plates 11, 12 and exhibits support elements 17, with which the support plate 15 supports the heating unit 1.3 to 9.3, wherein it is provided in particular that the support elements 17 fix the heating elements 1 to 9 in place with regard to their positional distance from the support plate 15 and their distance from each other, wherein it is provided in particular that at least the side of the support plate 15 facing the heating elements 1 be designed to reflect heat.

A device, characterized by a cover plate 14 that is arranged between the support plate 15 and contact plates 11, 12 and forms openings 18 through which the terminal contacts 1.1 to 9.2 extend;

A device, characterized in that a central heating device 10 with heating elements 1 to 9 is surrounded by outer heating devices 26, 29 that exhibit one or more heating elements 1 to 9, wherein the heating devices 10, 26, 29 exhibit heating elements 1 to 9 that can be energized independently of each other;

A device, characterized in that the support plate 15 is joined with at least one of the contact plates 11, 12 by means of a connecting element 27, wherein the connecting element 27 is joined with the contact plate 11, 12 in particular with an isolating body 32, 33.

A device, characterized in that the several heating units 10, 26, 29 are arranged in a circle around each other, wherein one first central heating device 10 exhibits a circular outline contour, and at least one radially outer heating device 26, 29 exhibits an annular outline;

A device, characterized in that a radially outermost heating device exhibits a plurality of adjacently running heating elements, which are electrically connected with each other by means of support elements;

A device, characterized in that the heating elements are comprised of filaments wound into helical turns, wherein the heating elements in particular are designed as twin filaments;

All disclosed features are essential to the invention (taken in isolation, but also in combination with each other). The disclosure of the application hereby also includes the disclosure content of the accompanying/attached priority documents (copy of preliminary application) in its entirety, also for the purpose of also incorporating features of these documents into the claims of the present application. The features in the subclaims characterize independent inventive further developments of prior art, in particular so as to generate partial applications based upon these claims.

| Reference List | |
|---|---|
| 1 | Heating element |
| 2 | Heating element |
| 3 | Heating element |
| 4 | Heating element |
| 5 | Heating element |
| 6 | Heating element |
| 7 | Heating element |
| 8 | Heating element |
| 9 | Heating element |
| 1.1 | Terminal contact |
| 2.1 | Terminal contact |
| 3.1 | Terminal contact |
| 4.1 | Terminal contact |
| 5.1 | Terminal contact |
| 6.1 | Terminal contact |
| 7.1 | Terminal contact |
| 8.1 | Terminal contact |
| 9.1 | Terminal contact |
| 1.2 | Terminal contact |
| 2.2 | Terminal contact |
| 3.2 | Terminal contact |
| 4.2 | Terminal contact |
| 5.2 | Terminal contact |
| 6.2 | Terminal contact |
| 7.2 | Terminal contact |
| 8.2 | Terminal contact |
| 9.2 | Terminal contact |
| 1.3 | Heating unit |
| 2.3 | Heating unit |
| 3.3 | Heating unit |
| 4.3 | Heating unit |
| 5.3 | Heating unit |
| 6.3 | Heating unit |
| 7.3 | Heating unit |
| 8.3 | Heating unit |
| 9.3 | Heating unit |

-continued

| Reference List | |
|---|---|
| 10 | Heating device |
| 11 | Contact plate |
| 12 | Contact plate |
| 13 | Gap |
| 14 | Cover plate |
| 15 | Support plate |
| 16 | Nut |
| 17 | Support element |
| 18 | Opening |
| 19 | Opening |
| 20 | Foot |
| 21 | Susceptor |
| 22 | Gas inlet unit |
| 23 | Process chamber |
| 24 | CVD reactor |
| 25 | Contact pin |
| 26 | Heating device |
| 27 | Connecting element |
| 28 | Opening |
| 29 | Heating device |
| 30 | Support element |
| 31 | Spacer |
| 32 | Isolating body |
| 33 | Isolating body |
| 34 | Foot |
| 35 | Slit |
| 36 | Locking element |
| 37 | Journal |
| 38 | Filament, tungsten wire |
| 39 | Filament, tungsten wire |
| E1 | First plane |
| E2 | Second plane |
| N.1 | Terminal contact |
| N.2 | Terminal contact |
| N.3 | Heating unit |

What is claimed is:

1. A device with at least one first electrically conductive contact plate (11) and with at least one second electrically conductive contact plate (12), and with a plurality of electrically parallel-connected first heating elements (1 to 9) each with at least one resistance heating unit (1.3 to 9.3), wherein each of the heating elements (1 to 9) is connected with the first contact plate (11) by means of a first terminal contact (1.1 to 9.1), and with the second contact plate (12) by means of a second terminal contact (1.2 to 9.2), wherein the two contact plates (11, 12) lie in a shared first plane (E1), wherein the resistance heating units (1.3 to 9.3) are arranged along a spiral or circular arc line around a center of the device, characterized in that several heating units (1.3 to 9.3) are situated along the circular arc or spiral line, lying one behind the other or nestled into each other, and the two first and second contact plates (11, 12) lying in a shared first plane (E1) exhibit contact extensions (11', 12') that intermesh in a comb-like manner.

2. The device according to claim 1, characterized in that the at least one resistance heating unit (1.3 to 9.3) is situated in a plane (E2) parallel to the shared first plane (E1) under a susceptor (21) of a process chamber (23) of a CVD reactor (24).

3. The device according to claim 2, characterized by terminal contacts (1.1 to 9.1, 1.2 to 9.2) running in a direction of a surface normal of the shared first plane, which extend at a 90° angle to the extension direction of the heating elements, wherein the resistance heating units (1.3 to 9.3) form an essentially 90° curve, or the terminal contacts (1.1 to 9.2) are formed at a 90° angle.

4. The device according to claim 3, characterized in that the heating elements (1 to 9) are the same length, and extend over the same arc length.

5. The device according to claim 1, characterized in that the first and second contact plates (11, 12) are spaced apart from each other by a distance (13), wherein the distance (13) is comprised in particular of an air gap.

6. The device according to claim 1, characterized in that the first and second contact plates (11, 12) consist of metal and are kept a distance apart from each other by a spacer (31) formed out of an isolator, wherein a connecting element (27) is allocated to the spacer (31).

7. The device according to claim 1, characterized in that a respective two adjacently arranged terminal contacts (1.2, 2.2; 2.1, 3.1; 3.2, 4.2 . . . , 8.2, 9.2) are allocated to a shared contact plate (11, 12).

8. The device according to claim 1, characterized by a support plate (15) that is arranged parallel to the first and second contact plates (11, 12) and exhibits support elements (17), with which the support plate (15) supports the at least one resistance heating unit (1.3 to 9.3).

9. The device according to claim 8, characterized in that the support elements (17) fix the first heating elements (1 to 9) in place with regard to their positional distance from the support plate (15) and their distance from each other.

10. The device according to claim 9, characterized in that at least a side of the support plate (15) facing the first heating elements is designed to reflect heat.

11. The device according to claim 10, characterized by a cover plate (14) that is arranged between the support plate (15) and the first and second contact plates (11, 12) and forms openings (18) through which the terminal contacts (1.1 to 9.2) extend.

12. The device according to claim 11, characterized in that a central heating device (10) with first heating elements (1 to 9) is surrounded by outer heating devices (26, 29) that exhibit one or more heating elements (1 to 9), wherein the heating devices (10, 26, 29) exhibit first heating elements (1 to 9) that can be energized independently of each other.

13. The device according to claim 12, characterized in that the support plate (15) is joined with at least one of the first and second contact plates (11, 12) by means of a connecting element (27), wherein the connecting element (27) is joined with the at least one of the first and second contact plates (11, 12) with an isolating body (32, 33).

14. The device according to claim 12, characterized in that the several heating units (10, 26, 29) are arranged in a circle around each other, wherein one first central heating device (10) exhibits a circular outline contour, and at least one radially outer heating device (26, 29) exhibits an annular outline.

15. The device according to claim 14, characterized in that a radially outermost heating unit (29) exhibits a plurality of adjacently running heating elements (1 to 5), which are electrically connected with each other by means of support elements (30).

16. The device according to claim 14, characterized in that the heating elements (1 to 9) are comprised of filaments (38, 39) wound into helical turns, wherein the heating elements (1 to 9) are designed as twin filaments (38, 39).

* * * * *